(12) United States Patent  
Jenkins et al.

(10) Patent No.: US 6,434,011 B1
(45) Date of Patent: Aug. 13, 2002

(54) PCMCIA COMPARTMENT

(75) Inventors: Michael D. Jenkins, Burke; John W. Williams, Gainesville, both of VA (US); Peter A. Ronzani, Los Gatos, CA (US); Peter S. Hong, Centreville, VA (US)

(73) Assignee: Xybernaut Corporation, Fairfax, VA (US)

( * ) Notice: Subject to any disclaimer, the term of this patent is extended or adjusted under 35 U.S.C. 154(b) by 0 days.

(21) Appl. No.: 09/645,843

(22) Filed: Aug. 24, 2000

Related U.S. Application Data

(63) Continuation-in-part of application No. 09/126,506, filed on Jul. 30, 1998, now abandoned, which is a continuation-in-part of application No. 08/975,964, filed on Nov. 21, 1997, now abandoned.

(51) Int. Cl.$^7$ ................................ H05K 5/00
(52) U.S. Cl. ............ 361/752; 361/753; 361/683; 312/223.2
(58) Field of Search ................ 361/752, 753, 361/736, 737, 683–685, 728–730, 740; 312/223.3; 174/51

(56) References Cited

U.S. PATENT DOCUMENTS

| | | | | |
|---|---|---|---|---|
| 5,169,218 A | * | 12/1992 | Chu | 312/223.2 |
| 5,513,074 A | * | 4/1996 | Ainsbury et al. | 361/737 |
| 5,661,634 A | * | 8/1997 | Obata et al. | 361/684 |

* cited by examiner

Primary Examiner—Kamand Cuneo
Assistant Examiner—Tuan Dinh

(57) ABSTRACT

This is a compartment that provides for increased protection of PCMCIA cards when used in computers. The compartment is covered by a movable door which can be moved to accommodate various size PCMCIA cards with various type projections. Since the entire horizontal portion of a PCMCIA card will seat in the compartment, a firm support is provided for the entire card.

8 Claims, 8 Drawing Sheets

PCMCIA COMPARTMENT

This application is a Continuation-in-Part Application of parent application Ser. No. 09/126,506 filed in the U.S. Patent and Trademark Office on Jul. 30, 1998, now abandoned which is a Continuation-in-Part Application of parent application Ser. No. 08/975,964 filed in the U.S. Patent and Trademark Office Nov. 21, 1997.

This invention relates to a computer component and, more specifically, to a housing for PCMCIA cards and the like.

BACKGROUND OF THE INVENTION

PCMCIA is the term commonly used to refer to Personal Computer Memory Card International Association. PCMCIA is an organization consisting of some 500 companies that have developed a standard for small, credit card-sized devices, called PC Cards. Originally these PC cards were initially intended for use in adding memory to portable lap top computers; the PCMCIA standard has been expanded several times and is now suitable for many types of devices. There are in fact three types of PCMCIA cards. All three have the same rectangular size (85.6 by 54 millimeters), but different widths and outside terminal portions. As defined in Personal Computer Dictionary by Philip E. Margolis, Random House, Second Edition:

Type I cards can be up to 3.3 mm thick, and are used primarily for adding additional ROM or RAM to a computer.

Type II cards can be up to 5.5 mm thick. These cards are often used for modem and fax modem cards.

Type III cards can be up to 10.5 mm thick, which is sufficiently large for portable disk drives.

As with the cards, PCMCIA slots also come in three sizes;

A Type I slot can hold one Type I card

A Type II slot can hold one Type II card or one Type I card.

A Type III slot can hold one Type III card or a Type I and Type II card.

Ideally, you should be able to exchange PC Cards on the fly, without rebooting your computer. For example, you should be able to slip in a fax modem card when you want to send a fax and then, when you are done, replace the fax modem card with a memory card. Unfortunately, because of deficiencies in the initial standard and poor implementations by card manufacturers, this has sometimes not worked as planned. However, the standard appears to be reaching a level of maturity where such plug-and-play installation is becoming a reality.

Some analysts believe that the PC card has the potential to become the dominant expansion technology for desktop model computers as well as portable computers.

PCMCIA cards are primarily designed to be fitted into PCMCIA slots, however because of the potential for damage to the portion of the P.C. card that extends out of the slot (dongle), a complete PCMCIA housing has been proposed in co-pending U.S. patent application Ser. No. 08/975,964. This housing with a door closing encloses a complete Type I or Type II or Type III card but cannot accommodate PC cards with large upwardly projecting end attachments.

In voice activated wearable computers, the PCMCIA door on the Mobile Assistant® (133P or MA IV) as discussed in U.S. Ser. No. 08/975,964 cannot accommodate all PCMCIA cards. This is because some PCMCIA card manufacturers have cumbersome attachments at the end of their cards. This is due, in part, because these manufacturers are driven by current standards of connectors and the need to conform to these standards. For example, Speech Solutions manufactures a Type II DSP-based speech recognition card that requires the user to attach a standard RCA-microphone jack to the card. Because there already exists microphones that have a certain type connector, Speech Solutions must be able to accommodate most of these connector types. This limits the minimum physical size the connector can be (in this case, it has to accommodate a ⅛ inch RCA jack). Other manufactures also have little or no flexibility to the size the PCMCIA connector can be, they are either limited by physical size of the device they want to attach to the PCMCIA card or are limited by what size the connector can be and still provide the necessary functionality of the card. An example of this might be a PCMCIA card that provides a wireless connection for communicating with other computers. In this example there is a need to have an antenna attached to the PCMCIA card in order for the card to be able to communicate with other devices. The challenge is to provide the smallest antenna possible and still deliver acceptable results. It should be kept in mind that the smaller the antenna, the smaller the area that the antenna can cover. This a balancing act that the manufacturer of the device has to deal with. There is a need to minimize the size of the device as much as possible without limiting the functionality of the device itself.

SUMMARY OF THE INVENTION

It is therefore an object of this invention to provide a PCMCIA (PC) card housing devoid of the above noted disadvantages.

Another object of this invention is to provide a PCMCIA card housing having a movable door adapted to accommodate various size and shapes of PCMCIA cards.

A further object of this invention is to provide a PC card housing that will minimize damage to any portion of the card including the end extending dongle.

Still a further object of this invention is to provide a sliding or movable door which covers said housing wherein the movable door provides for card enclosure in the housing with a minimum exposure of card components.

Yet another object of this invention is to provide a PC card housing and movable door that can accommodate Type I, Type II and Type III PCMCIA cards.

Another further object of this invention is to provide a PC card housing wherein a PC card can easily be inserted or removed from the computer.

Yet still another object of this invention is to provide A PCMCIA card housing where the card does not extend horizontally or longitudinally beyond the terminal portion of a computer where it could be damaged.

These and further objects of this invention are accomplished by a PCMCIA card housing that is large enough to accommodate all type of PCMCIA cards, with a flexible, slidable or movable door closure. This innovative door closure minimizes risk of damage to the dongle and other parts of the card. In prior art devices a substantial portion of the PCMCIA dongle is longitudinally exposed because it projects substantially out from the side portions of a computer. This is particularly undesirable in movable computers such as laptop or wearable computers of the prior art (see FIGS. 1 and 2 of this disclosure).

As provided by the present invention, a solution to this problem would be to allow the PCMCIA door to slide back, thus allowing the PCMCIA opening to accept nonstandard or large dongled cards. To prevent the PCMCIA opening from being exposed to the outside environments, the PCMCIA door can have attached to the door a rubber grommet that would provide protection to the inside of the PCMCIA compartment.

The slide back construction of the door of this invention is primarily designed for use with mobile computers but can be easily adapted for use with conventional computers or laptop computers. While the description of the door of this invention will be defined throughout this disclosure as used in a mobile computer, it should be understood that it can also be used in any type of computer that uses a PCMCIA card.

DETAILED DESCRIPTION OF THE DRAWINGS AND THE PREFERRED EMBODIMENTS

Figure 1:
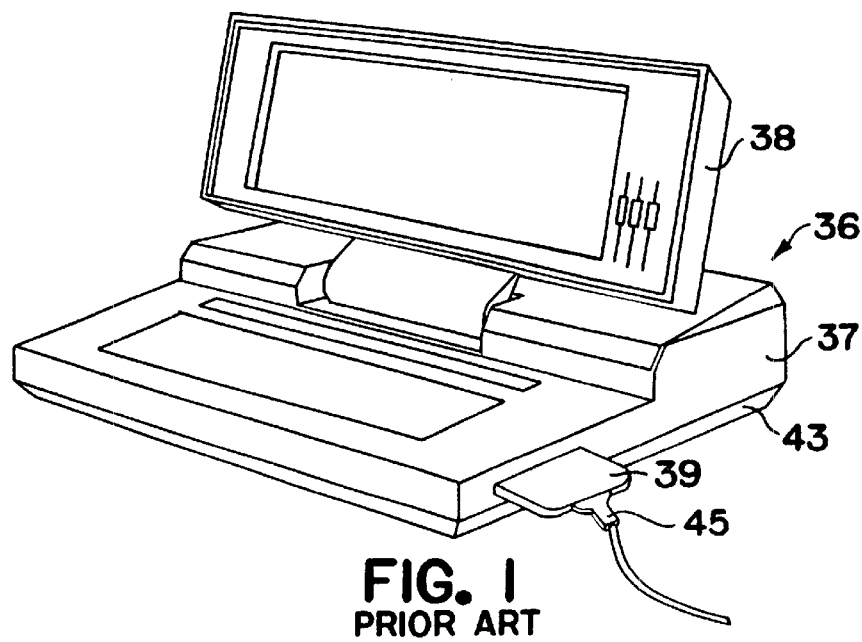
FIG. 1 is a perspective view of a laptop computer with a prior art PCMCIA card slot where the card extends longitudinally beyond the terminal end of the computer.

In FIG. 1 a laptop computer 36 as well known in the prior art is illustrated. The laptop 36 has the conventional components of a computer including a computer laptop housing 37 and a monitor 38. The PCMCIA (PC card) card 39 is shown as conventionally used and attached in a laptop 36. It can be seen in FIG. 1 that PC card 39 and its dongle 45 extend longitudinally to a large degree outside of the housing 37 beyond computer end 43 which exposes it to damage if contacted by any substantial force. Also in FIG. 2 a prior art mobile computer 40 is shown with PC card slot openings 41 which are adapted to receive PC cards 42. In both prior art devices shown in FIGS. 1 and 2, the PC cards 39 and 42 and their dongles 45 when in use extend longitudinally substantially beyond the side terminal computer portions 43 and 44 of the laptop 36 and mobile computers 40, respectively. In these prior art devices, the PC cards can be easily broken or damaged, especially in mobile computers, thus rendering the computer capability provided by the PCMCIA (PC) card non-functional. If the PCMCIA card only extended perpendicular to the longitudinal axis of the mobile computer, the card would be much less liable to be damaged.

Figure 2:
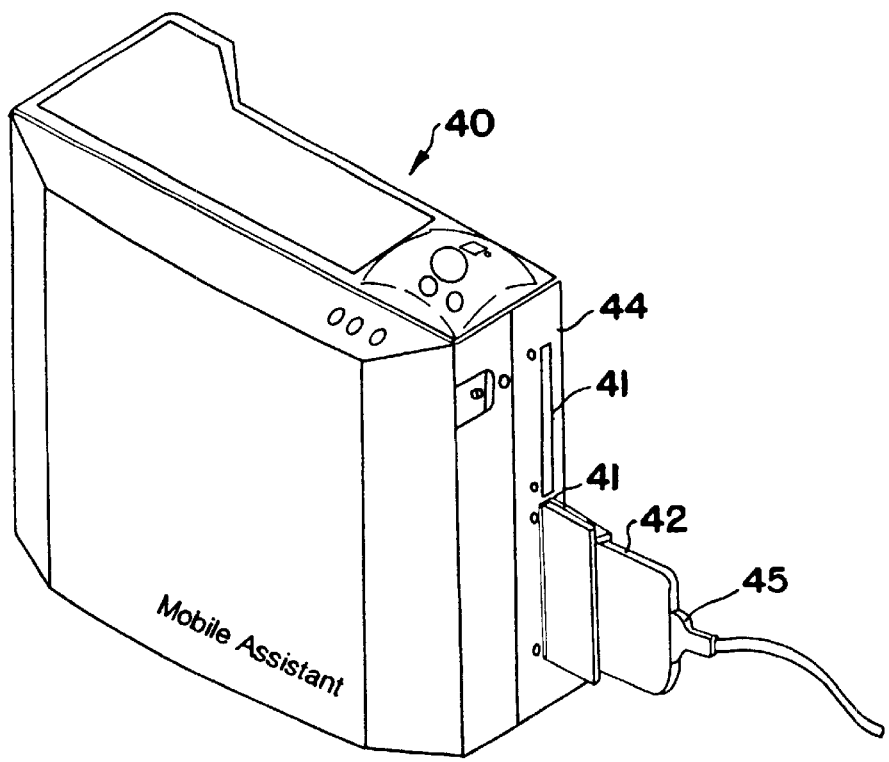
FIG. 2 is a perspective view of a mobile computer with a prior art PCMCIA card slot where the core extends longitudinally beyond the terminal end of the computer.
Figure 3A:
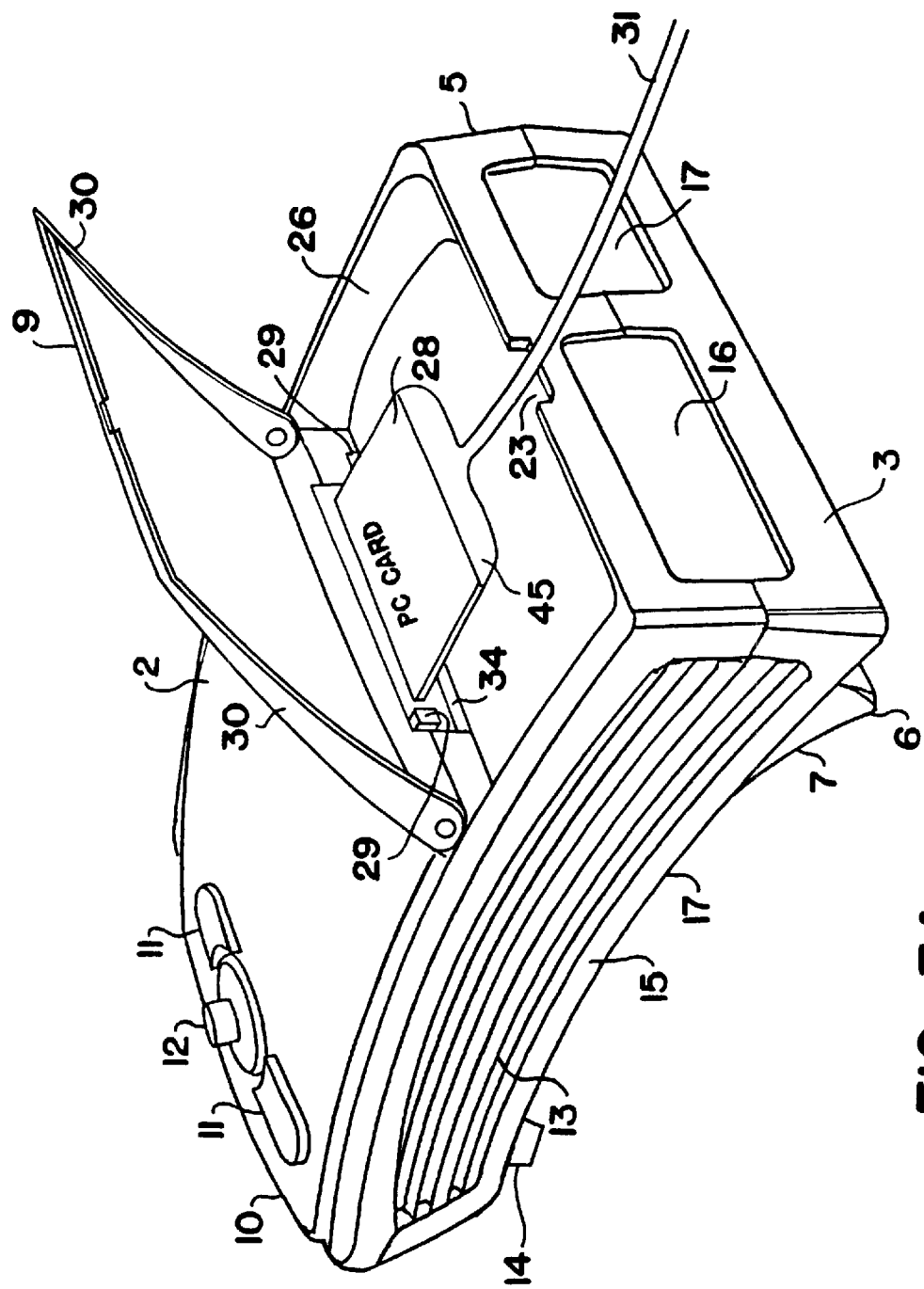
FIG. 3A is a perspective view of a mobile wearable computer with a prior art hinged door that encloses the PCMCIA card housing.
Figure 4:
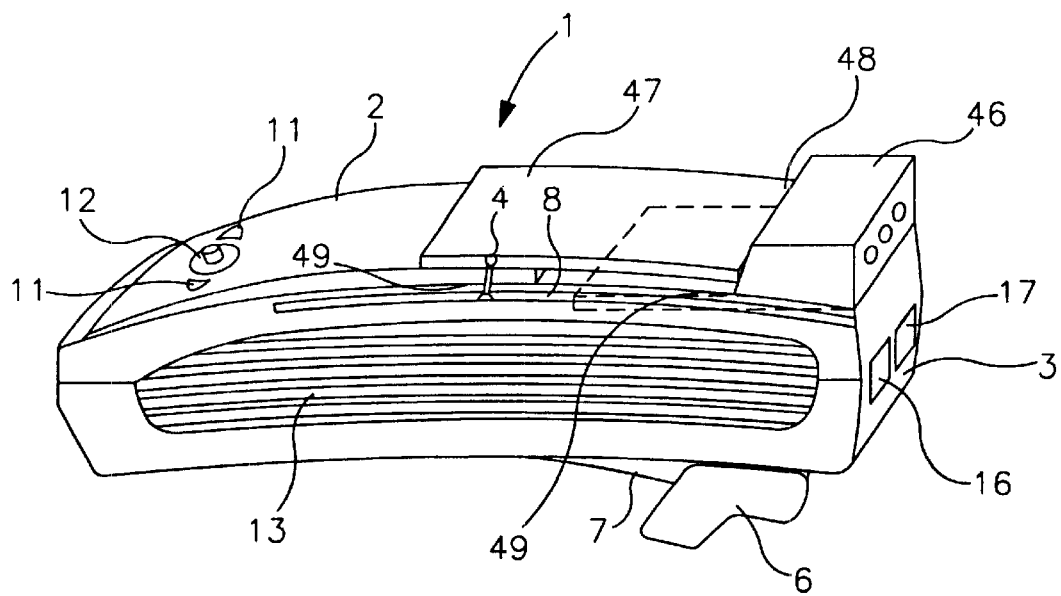
FIG. 4 is a perspective view of a mobile wearable computer including the PCMCIA housing and movable door of this invention.

In FIG. 3A the prior art mobile body-worn or body-supported computer 1 of parent application Ser. No. 08/975,964 is shown. In this figure, a lift hinged door 9 is shown which opens into a PC card compartment 26. When the PC card 28 is housed in compartment 26 and door 9 is closed, the cable 31 connecting from the housed PC card 28 is extended through slot 23. In one embodiment of this 7 prior art mobile computer the door 9 when open exposes a connection 34 for at least one PCMCIA card(s) (PC cards) 28 (one to four cards). This is an improvement of importance over the structures of FIGS. 1 and 2 since longitudinally extending PCMCIA cards (PC cards) shown in FIGS. 1 and 2 are exposed beyond the computer side and can easily be broken or damaged thus rendering the computer capability provided by the PCMCIA card non-functional. In this invention as shown in FIG. 4, the PC cards of Type I, II or III are housed totally within the housing 26, only the cable or connector 27 or upward projection 46 extends out from the housing 26 and hinged door 9 through slot 23. Also, the housing 26 permits sealing 30 around the door to make it weatherproof when worn outdoors. This internal housing 26 now provides means to prevent damaging the PC card 28 and means to weatherproof the card 28 and housing 26 from rain, water, snow or other inclement conditions. Ejecting means on buttons 29 are now easier to get to than the prior art buttons which are recessed and are hard to access. In addition, the pressure points on the PC card 28 are reduced in the present embodiment to further minimize damage to the card 28. Resilient waterproofing seal 30 is used to weatherproof the door and, as noted, protect the interior on housing 26 and card 28 from damage resulting from weather conditions. In FIG. 3A cable 31 which is connected to card 28 within housing 26 is shown with door 9 open but when closed it will hermetically seal in card 28. In FIGS. 3A, 4, 6, 7, 8 and 9 on the top front portion 10 of the computer housing 2 are central buttons 11 and joy stick or lever 12. The lever 12 is used to move and control a mouse pointer when the computer 1 is used as a mobile or conventional computer. The control buttons 11 are used for program execution or menu selection when the computer 1 is used as a conventional computer. These controls 11 and 12 are clearly illustrated in FIGS. 3A, 4, 6, 7, 8 and 9. On the sides of the computer 1 are located vent louvers (or a heat sink) 13 which allow the heat from inside the computer housing 2 to be dissipated or vented out to the atmosphere. These ribbed side vents or louvers 13 help reduce the inside heat which heat could cause malfunctioning or slowing down of the computer functions. The computer housing 2 is symmetrical so that when it is worn on either the right-hand side or left-hand side of the user's waist, the back section 5, peripheral connector or computer terminal section 3 and resulting cables will always face the back of the user. When the computer 1 is used or converted into a conventional computer and placed on a flat desk or other surface, a stationary stand 14 is used to support the front section 10 of the computer. This front stand 14 may also used as a belt loop (or handle) as shown in FIG. 3A. This same type mobile computer of FIG. 3A is used in the present invention except that housing 26 is made larger and door 9 is movable along the horizontal axis of computer 1 to accommodate all type PCMCIA cards. When computer 1 is used or converted to a conventional computer, cables 4 connect to components of a conventional computer such as monitors, keyboards, power supplies or any other desirable component. The louvered sides or vents 13 allow heat dissipation in this mode of use.

In FIGS. 3A, 4, 6, 7, 8 and 9 top front 10 of the computer is illustrated wherein control buttons 11 are easily accessible to both right and left-handed users. When the computer housing 2 is turned upside down in changing from right-hand to left-hand use, the controls of buttons 11 and mouse lever 12 always face the front of the user for easy access and use. Conversely, when right side 15 is facing up or down when worn, the controls 11 and 12 always face the front, cables 4 and outlets section 3 always face the back of the user. Controls or software can be provided to convert or reverse the functions of controls or buttons 11. Versa Points mouse pointing technology may be used as one suitable means in controls 11 and 12. Versa Point® is a trademark of Interlink Electronics of 547 Flynn Rd., Carnarillo, Calif. 93012. Opening 22 is IrDA port that can be used for wireless communications. IrDA (Infra Red Data Association) ports are know, for example, as disclosed in U.S. Pat. No. 5,491, 651 and other publications. IrDA are used as transceivers (transmit and receive) to communicate with local area networks, with printers, with another computer for transferring of information or data and other desired uses. The positioning of offset or recessed bottom extension 6 is shown slightly indented and below back portion 5 of the computer housing 2. The curvature 17 of housing 2 which is adjacent to the user's body is shown in FIG. 4. While FIG. 3A and the other applicable figures all show (for clarity purposes only) a rectangular configuration for housing 2, other shapes or configurations may be used if desirable. For example, an oval or circular configuration may be used if the other specifics of this invention as claimed are present. Openings 16 and 17 provide means for connecting to computer 1 other peripheral equipment such as floppy drives, bar code scanners, VGA port or external monitor connectors. Housing 2 preferably is constructed of a lightweight, structurally strong plastic. Peripheral outlets in section 3, any suitable number of them, may be used and are positioned bottom extension 6. Opening 23 is a cable opening for cables used with PCMCIA card slots.

Figure 3B:
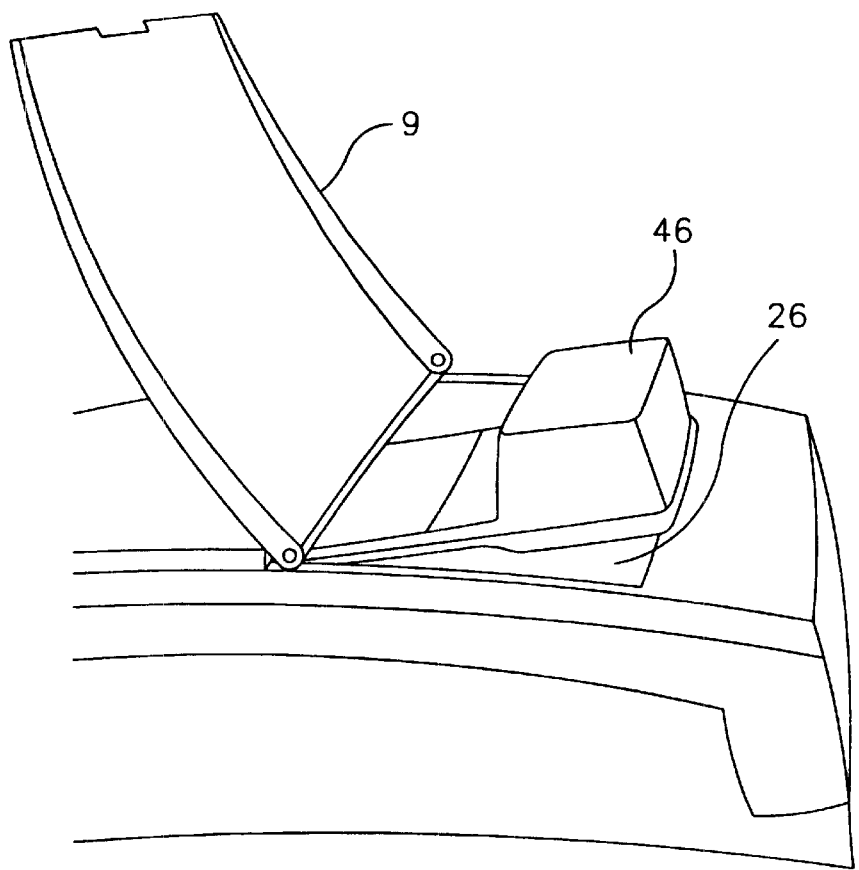
FIG. 3B is the computer of FIG. 3A with PCMCIA card having an upwardly projecting terminal portion.

While the structure of FIG. 3A is perfectly designed to protect dongles 45 from damage, it can be seen in FIG. 3B that PCMCIA end extensions 46 will not fit in compartment 26 of the structure shown in FIGS. 3A and 3B. The door 9 also will not close if the hinged door 9 of FIG. 3A is used. Not only is the compartment 26 of the computer housing shown in FIGS. 3A and 3B, not large enough to accommodate the PCMCIA card with projection 46, but also the door 9 will not close. Accordingly, the housing compartment 26 of the present invention needed to be enlarged and door 9 of FIG. 3A needed to be converted to a movable door 47 as shown in FIG. 4.

In FIG. 4, the PCMCIA card 48 fits into compartment 26 and has a solid underneath support and a coverage by movable door 47 of all but the upward projection 46. It is critical to this invention that no part of the PCMCIA card extend longitudinally beyond the end portion 3 of the computer. In a wearable computer it is very important that in PCMCIA cards, no component or dongle extend out where it could be easily damaged. An upward projection such as upward extension 46 will be within the limits of the computer and will not jut outward but rather will be within the confines of the computer 1. A waterproof edging 49 can be put around the periphery of door 47 and the upper section of compartment 26 to ensure protection to the inside of the PCMCIA compartment 26. While door 47 is shown in FIG. 4 as being slightly ajar and not touching end extension 46, this is for clarity only; in actual use door 47 would fit snugly against upward extension 46. The movable door 47 can fit above the top 2 of the computer housing 2 when slid back, and will fit flush with compartment housing opening 26 when in its closed mode.

Figure 5A:
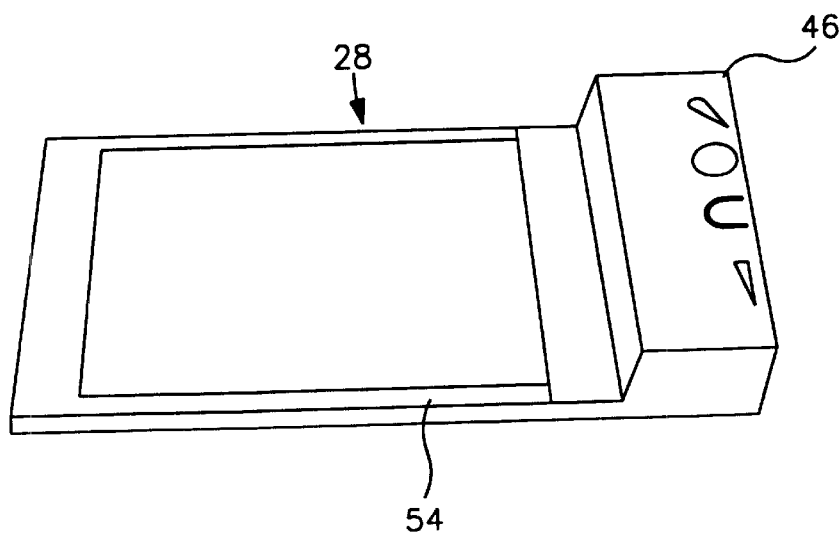
FIGS. 5A and 5B illustrate by perspective views various type PCMCIA cards used in present day computers.
Figure 5B:
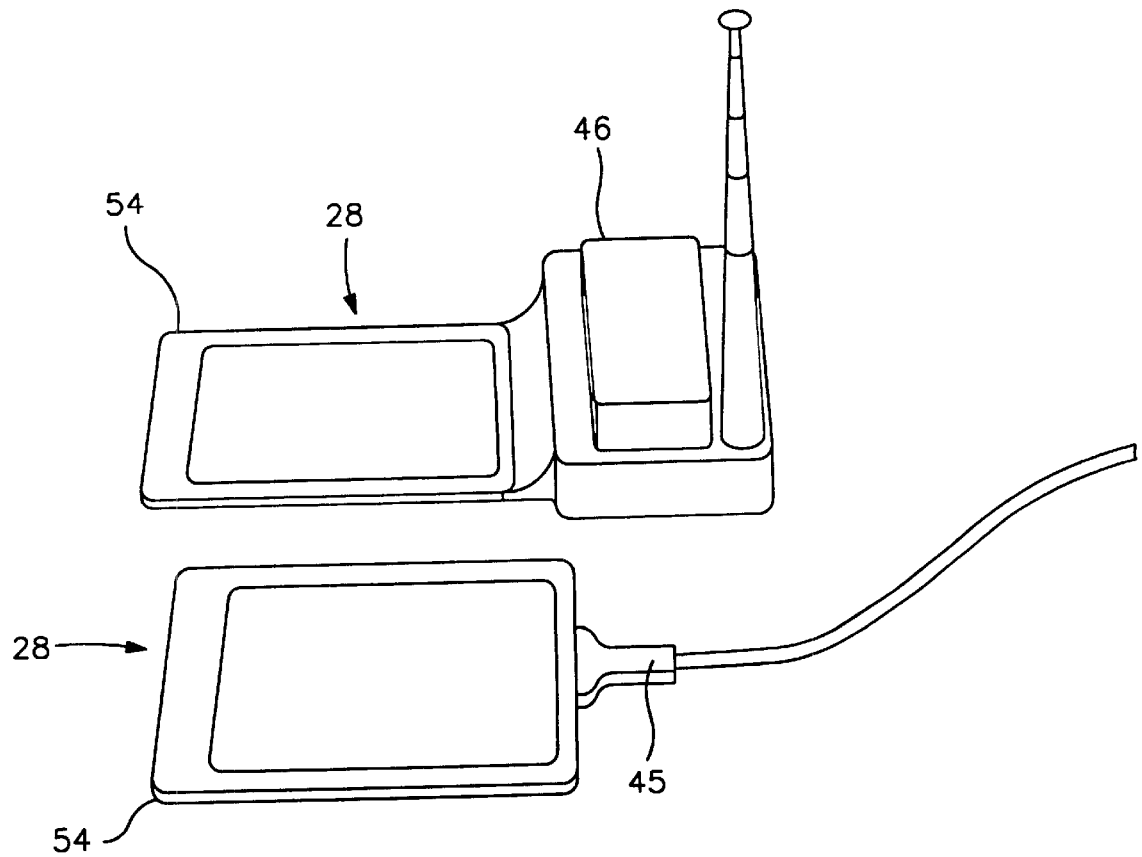

In FIG. 5, different types of PCMCIA cards are shown, each of which can be properly housed in compartment 26 of this invention. Type I, II and III PCMCIA cards are shown in FIG. 5.

Figure 6:
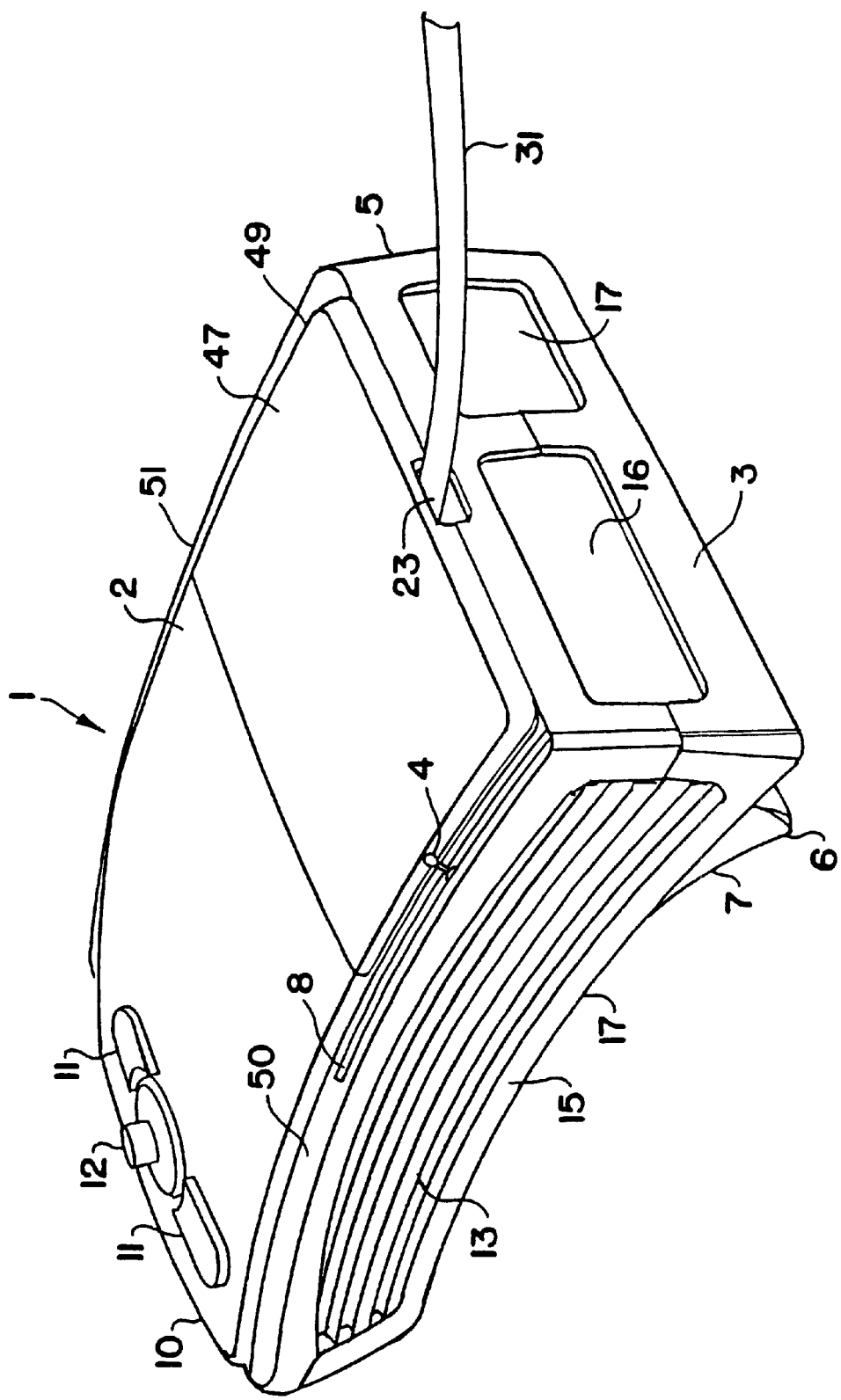
FIG. 6 is a perspective view of a mobile wearable computer including a first embodiment of the movable door of this invention when it is closed.
Figure 7:
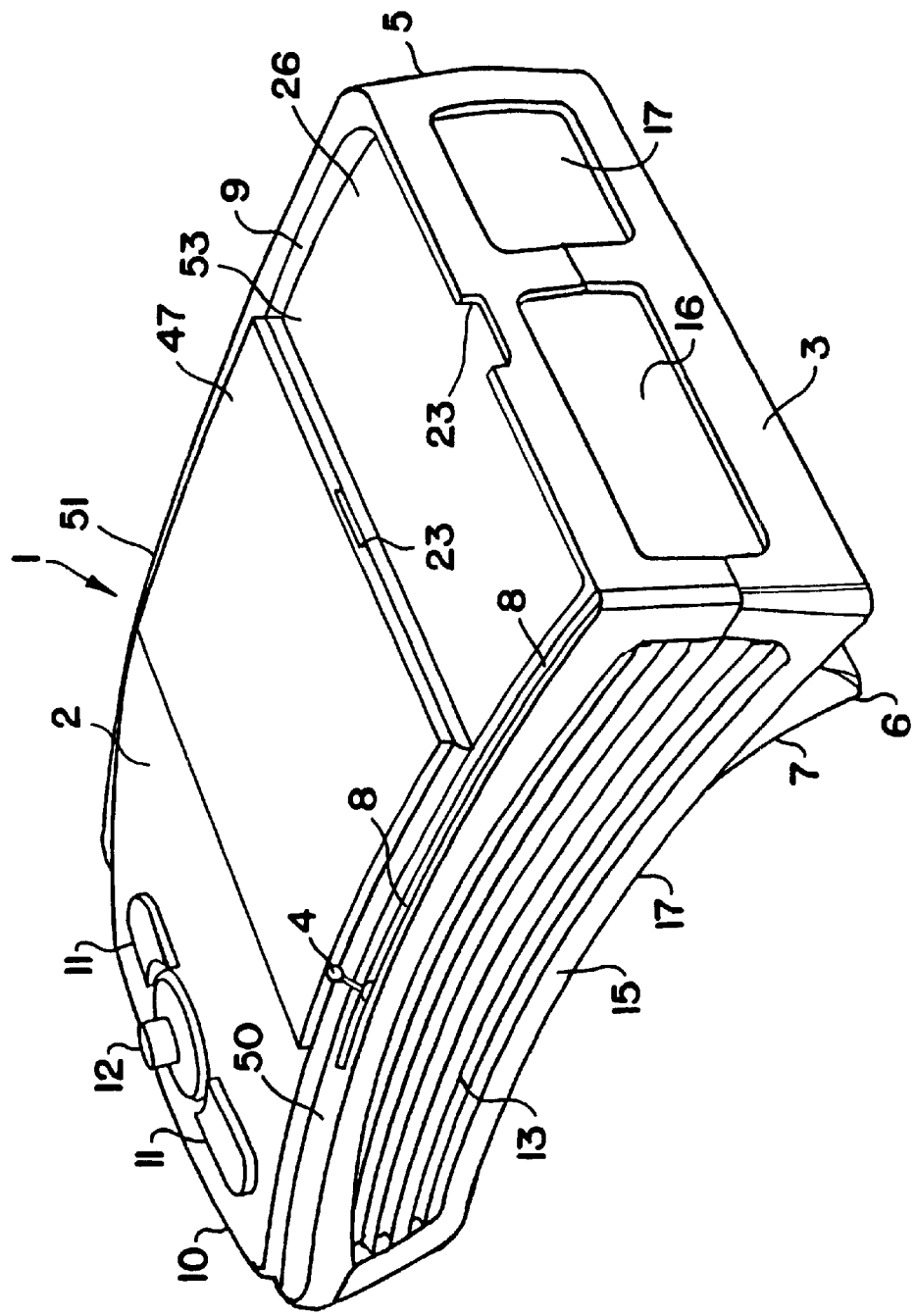
FIG. 7 is a perspective view of the mobile wearable computer of FIG. 6 with the movable door open.

FIGS. 4, 6, 7, 8 and 9 illustrate the novel PCMCIA compartment and movable door 47 of this invention. FIG. 4 shows the door 47 moved above and abutting computer top 2; this is accomplished by a structure shown in FIGS. 6 and 7. In FIG. 6 a sliding door 47 is connected by brackets 4 on both its sides 50 and 51 with bracket tracks 8. The end top portion of bracket 4 is fixed to the sides of door 47, and the end bottom portion of bracket 4 is slidably movable in track 8. When door 47 is moved or pushed back (toward controls 11 and 12) the door 47 fits above the top surface of computer housing 2 as shown in FIG. 7. This open mode shown in FIG. 7 leaves ample room in PCMCIA compartment housing 26 to accommodate projecting portions of PCMCIA cards, as shown in FIG. 4. It is critical to this invention (as shown in FIG. 4) that the projecting portion 46 not extend longitudinally importantly, not longitudinally beyond the terminal portion 3 of computer 1 where it could be damaged easily. This type of accommodation gives the PCMCIA card proper physical support within compartment 26 which is especially important in a wearable computer such as the Mobile Assistant® by Xybernaut Corporation. Once door 47 closes against projection or end extensions 46, the PCMCIA card is held firmly in place and projection 46 does not extend longitudinally beyond terminal portion 3 of the computer 1. Tracks 8 run along both sides 50 and 51 of the mobile computer 1 for a length equal to the desired movement of door 47. Slots 23 still are used to permit cables from dongles 45 to project when a standard PCMCIA card is used without an upward projection 46.

Figure 8:
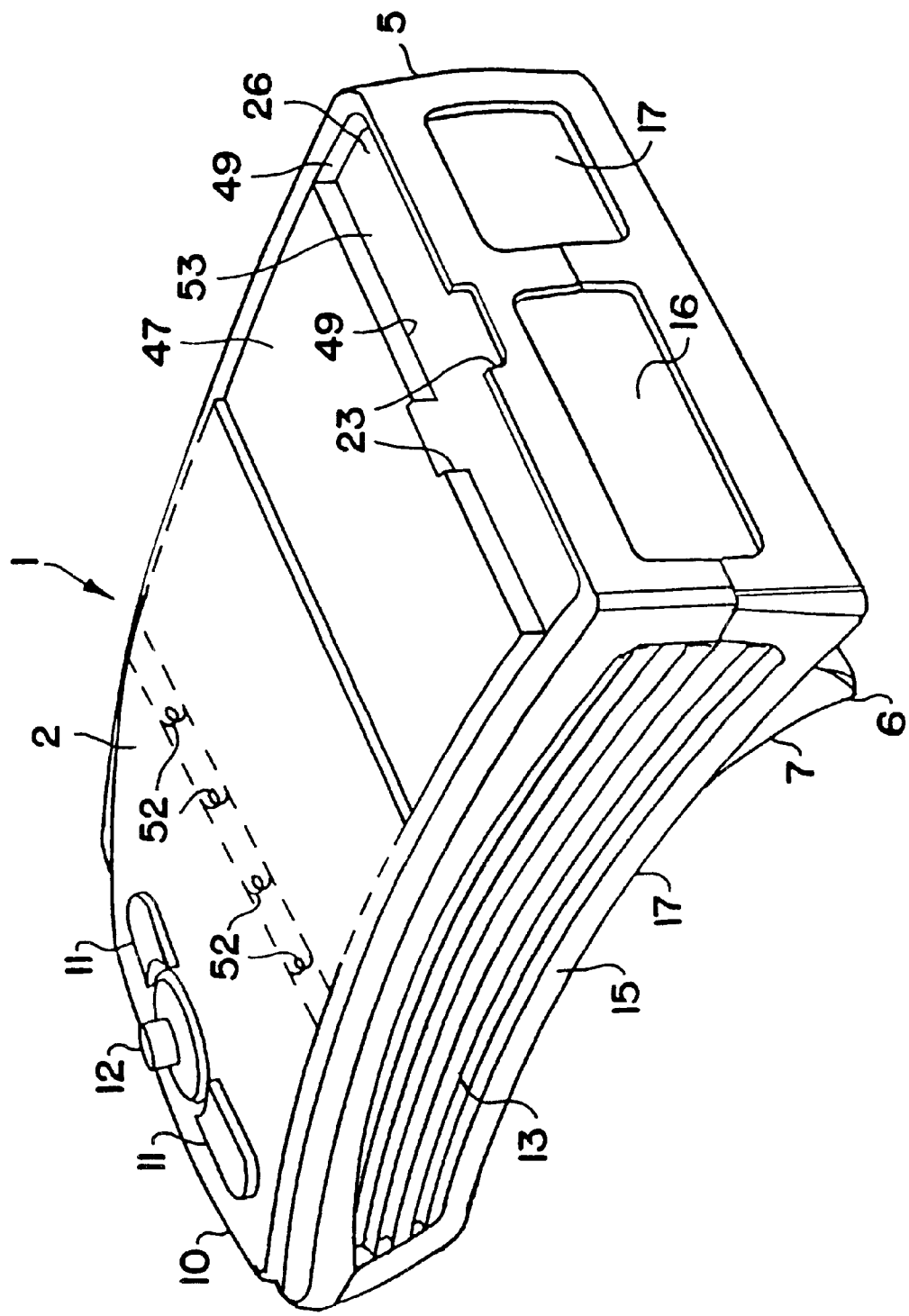
FIG. 8 is a perspective view of a mobile wearable computer including a second embodiment of the movable door of this invention in the open mode.
Figure 9:
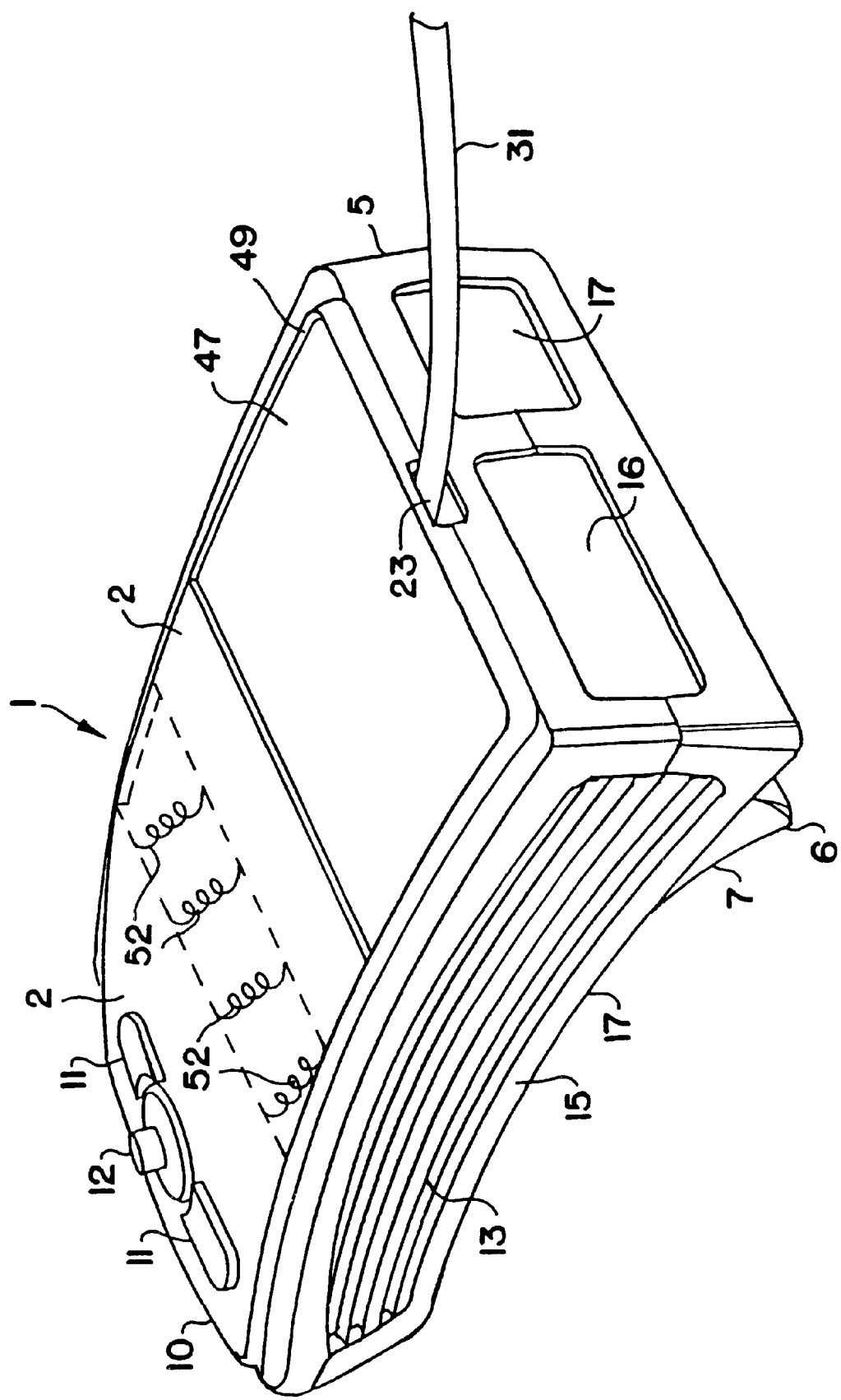
FIG. 9 is the computer of FIG. 8 with the movable door in a closed mode.

In FIGS. 8 and 9, a second embodiment of the movable door 47 is illustrated. Here the door 47 moves in or under the top surface of computer top 2. In this embodiment, the end of the door 47 closest to controls 11 and 12 is spring loaded by the use of a plurality of springs 52. As door 47 is pushed backward toward components 10, 11 and 12, the door provides an upper opening 53 in compartment 26 through which a PCMCIA projection 46 will extend. Door 47 then because it is spring loaded will push up against the projection 46 (as shown in FIG. 4) and hold the PCMCIA card in position. As noted earlier, a flexible rubber waterproofing element 49 can be put around the periphery of door 47 and opening 53 to prevent the opening or compartment 26 from being exposed to the outside environments. By "rubber" as used throughout, it is intended that any suitable grommet in addition to rubber may be used. The movable door 47 can be spring loaded as shown in FIGS. 8 and 9 or can be side hinged as shown in FIGS. 6 and 7. Obviously, any suitable movable door 47 will be considered within this invention.

In FIG. 5 various PCMCIA cards are illustrated, each having at least a horizontal or base portion 54 and some having an upwardly projecting portion 46. The movable compartment door 47 will cover substantially all of the horizontal portion 54 of a PCMCIA card but not any upwardly projecting portion 46 thereof; see in this regard FIG. 4, where portion 46 does not jut out beyond section 3. The compartment of recessed PCMCIA card housing 26 will contain substantially the entire card therein so that only the projecting portion 46 of the PCMCIA card is exposed. The PCMCIA card 28 thus can fully seat within the compartment 26 so that the movable door 47 will fit over the horizontal PCMCIA card portion 54 and abut against the upwardly projecting portion 46 of the PCMCIA card 28. The compartment 26 and movable door 47 of this invention provides the most secure known support for PCMCIA cards. Not only is the card support an important advantage of this invention, but also the ease with which a card may be inserted and held in a mobile or other computer structure.

The preferred and optimumly preferred embodiments of the present invention have been described herein and shown in the accompanying drawings to illustrate the underlying principles of the invention, but it is to be understood that numerous modifications and ramifications may be made without departing from the spirit and scope of this invention.

What is claimed is:

1. A voice activated user supported computer comprising therein a single enclosure computer that is fully supported by said user, a PCMCIA card housing, said card housing having dimensions large enough for a PCMCIA card to fully seat therein, a horizontally slidable door movably positioned on a top surface of the card housing, said slidable door operable to substantially horizontally move when opened on a plane substantially parallel to a horizontal axis of said card housing, said slidable door having a terminal portion to contact and abut against an upwardly projecting portion of said card when said card is seated therein and thereby to firmly hold said card in place, said housing contained therein substantially all of a horizontal portion of said PCMCIA card, and wherein only said upwardly projecting portion of said card is exposed but said upwardly projecting portion does not extend longitudinally beyond a terminal section of said computer, and wherein said slidable door is spring loaded on said top surface of said card housing in a manner which will permit said door to exert pressure upon and contact said upwardly projecting portion of said card to hold said card in place.

2. The voice activated user supported computer of claim 1 wherein when said PCMCIA card having a horizontal portion and an upwardly projecting portion is used, said housing and said horizontally slidable door will enclose substantially the entire horizontal portion.

3. The voice activated user supported computer of claim 1 wherein said slidable door has brackets which are positioned on each side of said door and wherein said brackets travel along a horizontally disposed track located in a side section of said computer, said door slidable on a plane substantially parallel to a horizontal axis of said housing.

4. The voice activated user supported computer of claim 1 wherein said slidable door is spring loaded above said card housing in a manner which will permit said door to exert pressure upon and contact and upwardly projecting portion of said card to hold it in place.

5. The voice activated user supported computer of claim 1 wherein said housing has a rubber grommet around its peripheral portion to protect the inside of said housing from weather elements.

6. The voice activated user supported computer of claim 1 wherein said movable door has a rubber grommet around said movable door's peripheral portion to protect the inside of said housing from weather elements.

7. The voice activated user supported computer of claim 1 wherein said slidable door has means to fit above a top or other surface of said voice activated user supported computer.

8. A computer comprising therein a single enclosure computer that is fully supported by a user comprising a PCMCIA card housing, said card housing having dimensions large enough for a PCMCIA card to fully seat therein, a horizontally slidable door movably positioned on a top surface of the card housing, said slidable door operable to substantially horizontally move when opened on a plane substantially parallel to a horizontal axis of said card housing, said slidable door having a terminal portion to contact and abut against an upwardly projecting portion of said card when said card is seated therein and thereby to firmly hold said card in place, said housing contained therein substantially all of a horizontal portion of said PCMCIA card, and wherein only said upwardly projecting portion of said card is exposed but said upwardly projecting portion does not extend longitudinally beyond a terminal section of said computer, and wherein said slidable door is spring loaded on said top surface of said card housing in a manner which will permit said door to exert pressure upon and contact said upwardly projecting portion of said card to hold said card in place.

* * * * *